US007271876B2

(12) United States Patent
Ulrich et al.

(10) Patent No.: US 7,271,876 B2
(45) Date of Patent: Sep. 18, 2007

(54) PROJECTION OBJECTIVE FOR MICROLITHOGRAPHY

(75) Inventors: Wilhelm Ulrich, Aalen (DE); Gerhard Fuerter, Ellwangen (DE); Michael Gerhard, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 34 days.

(21) Appl. No.: 10/919,376

(22) Filed: Aug. 17, 2004

(65) Prior Publication Data

US 2005/0134826 A1 Jun. 23, 2005

(30) Foreign Application Priority Data

Aug. 20, 2003 (DE) ............... 103 38 983

(51) Int. Cl.
*G03B 27/54* (2006.01)
*G03B 27/72* (2006.01)
(52) U.S. Cl. .......................... 355/67; 355/71
(58) Field of Classification Search ........... 355/53, 355/67, 71
See application file for complete search history.

(56) References Cited

U.S. PATENT DOCUMENTS

| 5,365,371 | A | * | 11/1994 | Kamon ............... 359/483 |
| 5,967,635 | A | * | 10/1999 | Tani et al. ............ 353/20 |
| 6,384,974 | B1 | | 5/2002 | Joubert et al. |
| 6,480,330 | B1 | | 11/2002 | McClay et al. |
| 2001/0019404 | A1 | * | 9/2001 | Schuster et al. ........ 355/67 |
| 2002/0164105 | A1 | * | 11/2002 | Simpson et al. ........ 385/11 |
| 2002/0176166 | A1 | * | 11/2002 | Schuster ............. 359/494 |
| 2003/0039028 | A1 | * | 2/2003 | Oskotsky et al. ....... 359/366 |
| 2004/0051928 | A1 | * | 3/2004 | Mi .................... 359/247 |
| 2005/0012917 | A1 | * | 1/2005 | Tanaka et al. .......... 355/67 |

FOREIGN PATENT DOCUMENTS

| DE | 198 51 749 A1 | 5/2000 |
| DE | 101 27 227 A1 | 12/2002 |
| DE | 102 29 614 A1 | 1/2004 |
| DE | 102 40 598 A1 | 3/2004 |
| EP | 0 964 282 A2 | 12/1999 |

OTHER PUBLICATIONS

Shr-Jia Shiu et al., Electron Beam Lithography for Fabricating Sub-Wavelength Grating on Quartz, National Chiao Tung University Hsinchu, Taiwan.
Rong-Chung Tyan et al., Polarizing beam splitters constructed of form-birefringent multilayer gratings, SPIE Proc., vol. 2689, pp. 82-89.

* cited by examiner

*Primary Examiner*—Peter B. Kim
*Assistant Examiner*—Marissa A. Ohira
(74) *Attorney, Agent, or Firm*—Sughrue Mion, PLLC

(57) ABSTRACT

A projection objective for microlithography for imaging a pattern arranged in the object plane of the projection objective into the image plane of the projection objective has at least one polarization splitter device that is operated only once in transmission or reflection. By using this device, polarization-dependent differences in the intensity and response of the light passing through the objective, which lead to a worsening of the imaging quality of the projection objective, can largely be avoided.

6 Claims, 5 Drawing Sheets

PROJECTION OBJECTIVE FOR MICROLITHOGRAPHY

The following disclosure is based on German patent application no. 103 38 983.0 filed on Aug. 20, 2003, which is incorporated into this application by reference.

BACKGROUND OF THE INVENTION

1. Field of the Invention

The invention relates to a projection objective for microlithography for imaging a pattern arranged in an object plane of the projection objective into an image plane of the projection objective.

2. Description of the Related Art

Projection objectives of this type are used in projection exposure systems for the production of semiconductor components and other finely structured components, in particular in wafer scanners and wafer steppers. They are used to project patterns of photo masks or graduated plates, which will also be designated masks or reticles in the following text, onto an object coated with a light-sensitive layer at the maximum resolution and on a reducing scale.

In this case, in order to produce finer and finer structures, it is necessary firstly to increase the image-side numerical aperture (NA) of the projection objective and secondly to use shorter and shorter wavelengths, preferably ultraviolet light with wavelengths of less than about 260 nm.

In this wavelength range, only a few adequately transparent materials are available for the production of optical components, in particular synthetic quartz glass and fluoride crystals such as calcium fluoride. By means of intrinsic and/or voltage-induced birefringence, when light passes through these materials, a difference in the path between light having a first component of the electric field strength vector and light having a second component of the electric field strength vector perpendicular to this first component can occur.

Since the Abbé constants of the materials available for this wavelength range lie relatively close to one another, it is difficult to provide purely refractive systems with adequate correction of color errors. Therefore, for high-resolution projection objectives use is predominantly made of catadioptric systems in which, apart from refractive elements, reflective elements, for example concave mirrors and deflection mirrors, are also used. During reflection at such an element, the light is generally influenced as a function of polarization, specifically in such a way that a difference in response can occur between light having a first component of the electrical field strength vector, which oscillates perpendicular to the plane of incidence (s-polarized light) and light having a second component, which oscillates parallel to the plane of incidence (p-polarized light).

The two facts outlined above can contribute to the optical path length traced in the projection objective by the light having a first component of the electrical field strength vector differing from that traced by the light having a second component of the electrical field strength factor perpendicular to the first component. In the image plane, the result is the production of two mutually offset partial images (double images), which results in a worsening of the image contrast.

In catadioptric systems, it has additionally been observed that, under certain imaging conditions, various structure directions contained in the pattern to be imaged are imaged with different contrast, so that, in the photoresist, different line widths occur from the various structure directions. This can be attributed, inter alia, to the fact that, at a reflective optical component, such as is normally used in catadioptric projection objectives for microlithography, light polarized perpendicular to the plane of incidence is reflected more strongly than light polarized parallel to the plane of incidence, that is to say the intensity ratio of s-polarized to p-polarized light at the exit from the projection objective differs from the intensity ratio at the entry. Since the deflection mirrors used in catadioptric systems are normally operated with large angles of incidence, at which the difference in the reflectance between s-polarized and p-polarized light is particularly high, considerable differences can occur in the intensity ratio of s-polarized to p-polarized light at the entry and exit from the projection objective.

Patent publication DE 198 51 749 A1 discloses a catadioptric projection objective in which effects dependent on polarization, which arise as a result of different reflection as a function of the direction of polarization and therefore produce differences in response and displacement of the position of the beam of rays producing the image on the wafer, are compensated for by matching dielectric reflex layers or by means of additional non-coplanar deflections. The disadvantage with the last-named solution is that it requires considerable expenditure on construction.

Patent application DE 102 40 598.0 from the applicant, which is not a prior publication, discloses an optical imaging system having a first and second reflection mirror, in which a ratio $R_{sp}$ between the reflectance $R_s$ of a deflection mirror for s-polarized light and the reflectance $R_p$ of the deflection mirror for p-polarized light from a range of angles of incidence covering the associated tilt angle is greater than one in the case of one of the deflection mirrors and less than one in the case of the other deflection mirror. Such an apparatus can be used for the purpose of compensating for the polarization-changing action of one deflection mirror with the aid of the second deflection mirror.

SUMMARY OF THE INVENTION

It is one object of the invention to provide a projection objective for microlithography in which negative influences on the imaging quality, which can be produced by polarization-dependent effects as light passes through this projection objective, are reduced substantially.

As a solution to this and other objects, the invention, according to one formulation, provides a projection objective for microlithography for imaging a pattern arranged in an object plane of the projection objective into an image plane of the projection objective comprising at least one polarization splitter device that is operated only once in transmission or reflection between object plane and image plane.

Advantageous developments are specified in the dependent claims. The wording of all the claims is incorporated in the content of the description by reference.

A projection objective according to the invention has, at at least one point, a polarization splitter device which largely or substantially completely discards one direction of polarization of the light which passes through the projection objective as far as the polarization splitter device. A difference in response arising in the light path before this polarization splitter device between two mutually perpendicular directions of polarization therefore no longer plays any part in the imaging properties of the projection objective. In the light path after the polarization splitter device, by using only one polarization component, a difference in response can no longer occur, provided that polarization-changing elements are no longer used there. The intensity difference explained at the beginning between s-polarized and p-polarized light following reflection at reflective optical components which, for example, are used for beam folding in dioptric or in catadioptric systems, can likewise be avoided by the use of a polarization splitter device according to the invention. The polarization splitter device is used only once in transmission or reflection, as a result of which light losses are limited and undesired disruption of the image by the polarization splitting can be minimized.

Since the imaging quality of the projection objective is improved significantly by the invention, an intensity loss in the light, possibly arising as a result of filtering of a polarization component, plays a subordinate part in many cases. This can be limited by suitable measures, for example by the selection of a suitable illumination mode.

Wavefront aberrations, such as can occur in a projection objective for microlithography, may normally be corrected effectively only for one direction of polarization; if it is wished to optimize the projection objective for a second direction of polarization perpendicular to a first direction of polarization, the result of the correction which has been made for the first direction of polarization is necessarily made worse. The invention permits effective correction of wavefront aberrations since only one direction of polarization contributes to the production of the image, for which the projection objective can be corrected effectively by means of matching or aspherizing lens elements.

If the polarization splitter device is designed as a transparent optical element provided with at least one polarization splitter structure, then the polarization splitter structure can be applied, for example, to the front and/or rear of this optical element. In a preferred embodiment, at least one polarization splitter structure is applied to an optical element already present in the projection objective. In this case, an optical element can be constructed in one piece or many parts.

A polarization splitter structure can be formed in various ways, for example as a multilayer system in which dielectric layers with a high and low refractive index alternate. Such layer systems are customarily operated at angles of incidence in the vicinity of the Brewster angle, that is to say typically at an angle of incidence of about 45°. Suitable dielectric polarization splitter multilayer systems of this kind are described, for example, in U.S. Pat. No. 6,480,330 B1.

In particular for very small angles of incidence, that is to say if the light striking the polarization splitter structure strikes it substantially perpendicularly, it is possible to use polarization splitter structures whose structure sizes lie below the wavelength of the light used. Such structures act like birefringent material on the light passing through, on account of their form or structure, and can therefore be used for polarization splitting. Polarization splitters which use this effect of "form birefringence" are described, for example, in U.S. Pat. No. 6,384,974 B1.

It is possible to form the polarization splitter device as a plane-parallel plate, which is arranged in such a way that it is transilluminated substantially perpendicularly by the light passing through the projection objective, so that said plate, apart from the filtering of a direction of polarization, which, for example, can be achieved by applying a polarization-selective diffractive structure to the plate, has no additional influence on the course of the light path.

It is also possible to introduce a plane-parallel plate obliquely into the beam path, that is to say inclined at a predefined angle with respect to a plane perpendicular to the optical axis. When light passes through this plate, even in the case of an uncoated plate, there is more intense attenuation during transmission of the light polarized perpendicular to the plane of incidence as compared with light polarized parallel to the plane of incidence, so that at least partial filtering of s-polarized light is achieved without the application of polarization-changing layers. In this case, the plane-parallel plate should be introduced into the beam path at a point at which the incident bundle of light consists of substantially parallel partial rays. In the event of non-parallel incidence of light, a variation in the polarization state occurs for different rays in the bundle. In this case, the plane-parallel plate can be matched in terms of its polarization-changing action to other optical elements of the projection objective, for example to a folding mirror placed obliquely, in such a way that a desired, in particular an overall polarization-maintaining, influence on the polarization occurs. The offset of the light beam occurring when a plane-parallel plate introduced obliquely into the beam path is used, and any imaging errors which may possibly occur which are not rotationally symmetrical with respect to the optical axis, can be compensated for again by means of a further plate with similar dimensioning which, with respect to a plane perpendicular to the optical axis, is inclined oppositely to the first plate.

If the polarization splitter device is arranged as the last optical element of the objective in the vicinity of the image plane, then there are no longer any polarization-changing elements in the beam path after said polarization splitter device. The polarization state present at the exit from the polarization splitter device is therefore available unchanged for the imaging.

In a preferred embodiment, the polarization splitter device forms the possibly interchangeable terminating plate of the objective, so that no additional optical element has to be introduced into the objective. If the terminating plate reflects s-polarized light and lets p-polarized light through then, in the case of annular illumination and appropriately convergent, annular incidence of light, this leads to primarily radially polarized light being available for the production of an image, which effects good injection of the light into the resist. The light loss can be kept low in this embodiment if the illumination is likewise radially polarized.

In one embodiment, there is in the projection objective at least one deflection mirror, usually for the purpose of beam folding, which is formed as a polarization splitter device. If the polarization splitting is effected by at least one polarization splitter structure being applied to the mirror surface for this purpose, and being formed as a dielectric multilayer system in order to reflect essentially s-polarized light, then such a multilayer system can be produced particularly easily since this effect, which is particularly highly pronounced at high angles of incidence, that s-polarized light is reflected more intensely at a reflective surface than p-polarized light, merely needs to be amplified.

In one embodiment, the projection objective constitutes a catadioptric objective having a concave mirror and a beam deflection device. In this case, the beam deflection device can have a first mirror surface for deflecting the radiation coming from the object plane to the concave mirror and a second mirror surface for deflecting the radiation reflected from the concave mirror in the direction of the image plane. In this embodiment, one or both mirror surfaces can be formed as a polarization splitter device. Other folding geometries are likewise possible, for example those in which the light coming from the object plane strikes the concave mirror first and only then one or more deflection mirrors. In these variants, it is advantageous that no additional structural elements have to be used, since the polarization splitter device is an optical element already present in the objective.

If, when two (or more) deflection mirrors are used, the first mirror surface is chosen to be a polarization splitter device and the latter is formed in such a way that essentially p-polarized light is reflected from the mirror surface, then it is possible for a non-negligible part of the light intensity to be lost at the second mirror surface, but the following lenses can effectively be rendered nonreflective. A mirror surface at which p-polarized light is reflected more strongly than s-polarized light is described, for example, in DE 102 40 598 from the applicant, already cited above, whose disclosure content is incorporated in the content of this description by reference. If essentially s-polarized light is reflected from the first mirror surface, a greater part of this light will be reflected at the second mirror surface, but under certain circumstances it is more difficult to effectively render following lenses nonreflective.

If the second mirror surface is chosen to be a polarization splitter device, then the dioptric part of the objective follows directly in the course of the beam. Only the following lenses are therefore still able to change the polarization state.

In the beam path after the polarization splitter device there is linearly polarized light. However, if the photoresist is exposed in the image plane of the projection objective, it is frequently not intended for linearly polarized light to be used, since this can lead to contrast differences which depend on the structure direction. It is therefore expedient to convert the linear polarization of the light into circularly polarized light before leaving the objective, by means of a suitable delay element, for example a λ/4 plate.

In many variants of the invention, the polarization splitter device used is an optical element which is already present in the objective, as a result of which the expenditure on the structure needed for the implementation of the invention can be kept low, which contributes to saving costs. The use of the optical element as a polarization splitter device or modification of a conventional transparent or reflective component to form a polarization splitter device is made possible by the fact that at least one polarization splitter structure is applied to said element, for example a dielectric multilayer system, a structure with structure-induced birefringence (form birefringence) or a diffractive structure. As a result of the low expenditure on the structure, it is in this case possibly also possible to equip projection objectives that have already been finished with a polarization splitter device according to the invention.

The above and further features emerge from the description and the drawings, as well as from the claims, it being possible for the individual features in each case to be implemented on their own or in a plurality in the form of subcombinations in embodiments of the invention and in other fields and to represent embodiments which are advantageous and capable of protection on their own.

DETAILED DESCRIPTION OF THE PREFERRED EMBODIMENTS

Figure 1:
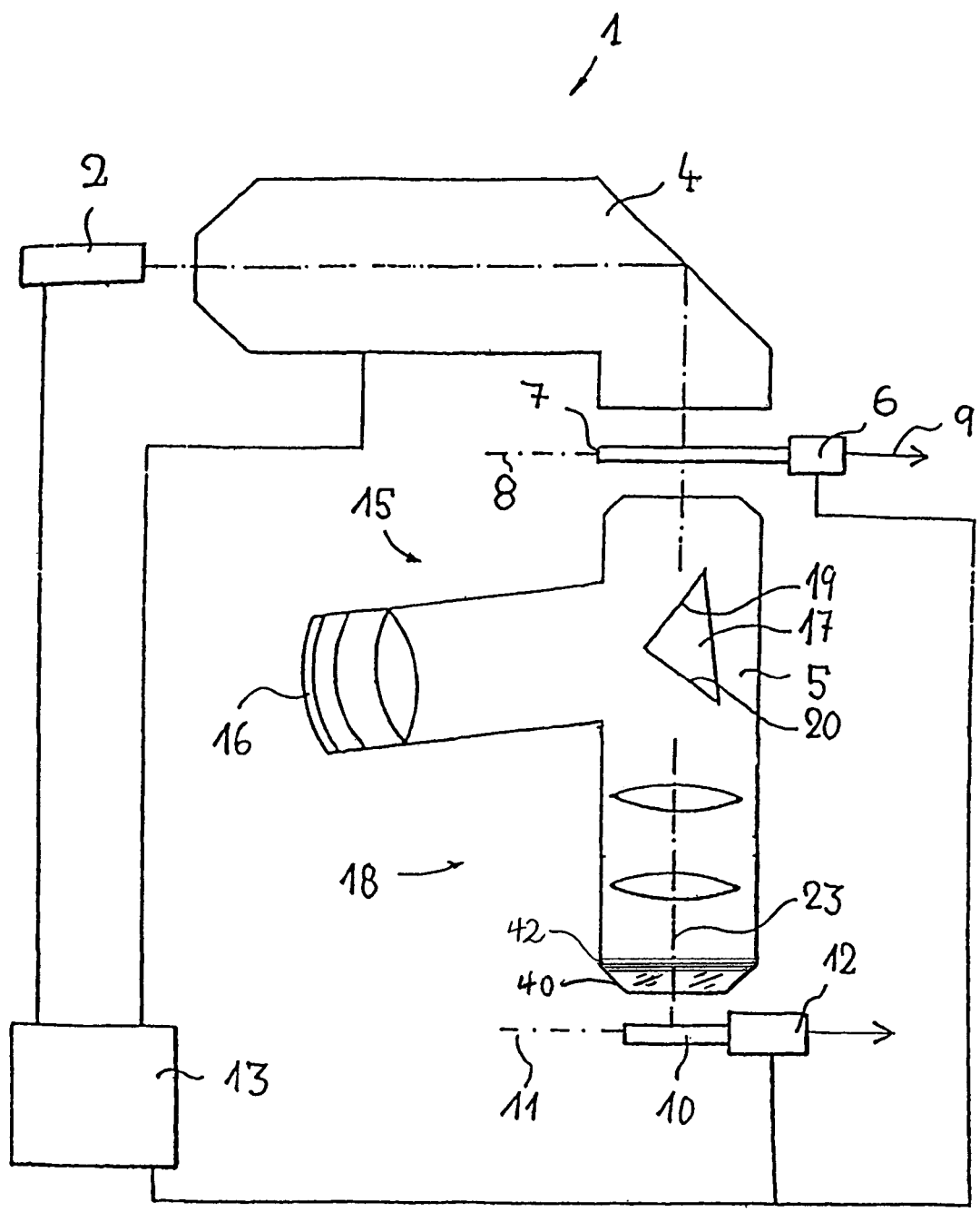
FIG. 1 is a schematic illustration of a microlithography projection exposure system formed as a wafer scanner, which comprises a catadioptric projection objective with geometric beam splitting according to one embodiment of the invention.

In FIG. 1 a microlithography projection exposure system in the form of a wafer scanner 1, which is provided for the production of highly integrated semiconductor components, is shown schematically. The projection exposure system comprises, as light source, an excimer laser 2, which emits ultraviolet light with a working wavelength of 157 nm which, in other embodiments, can also be above this, for example at 193 nm or 248 nm, or below this. An illumination system 4 connected downstream produces a large, sharply delimited and homogeneously illuminated image field, which is matched to the telecentric requirements of the projection objective 5 connected downstream. The illumination system has devices for selection of the illumination mode and, for example, can be changed over between conventional illumination with a variable coherence level, annular field illumination and dipole or quadrupole illumination. Arranged after the illumination system is a device 6 for holding and manipulating a mask 7, such that the mask lies in the object plane 8 of the projection objective and can be moved in this plane by means of a scanning drive in a direction of travel 9 (y direction) for scanner operation.

After the mask plane 8 there follows the projection objective 5, which acts as a reduction objective and projects an image of a pattern arranged on the mask on a reduced scale, for example on a scale of 1:4 or 1:5, onto a wafer 10 which is covered with a photoresist layer and which is arranged in the image plane 11 of the reduction objective. Other reduction scales, for example more intense reductions of up to 1:20 or 1:200, are possible. The wafer 10 is held by a device 12 which comprises a scanner drive in order to move the wafer synchronously with the reticle 7 and parallel to the latter. All the systems are controlled by a control unit 13.

The catadioptric projection objective 5 operates with geometric beam splitting and, between its objective plane (mask plane 8) and its image plane (wafer plane 11), has a catadioptric objective part 15 having a first deflection mirror 19 and a concave mirror 16, the flat deflection mirror 19 being tilted with respect to the optical axis 23 of the projection objective such that the radiation coming from the object plane is deflected by the deflection mirror 19 in the direction of the concave mirror 16. In addition to this mirror 19 needed for the function of the projection objective, a second, flat deflection mirror 20 is provided, which is tilted with respect to the optical axis in such a way that the radiation reflected from the concave mirror 16 is deflected by the deflection mirror 20 in the direction of the image plane 11 to the lenses of the following dioptric objective part 18. The mirror surfaces 19, 20, which are perpendicular to each other and flat, are provided on a beam deflection device 17 formed as a mirror prism and have parallel tilt axes perpendicular to the optical axis 23.

At the end of the dioptric objective part 18 that faces the image plane, a terminating plate 40 is fitted as the last optical element, to whose light entry side a plurality of flat layers 42 which act overall in a polarization-selective manner are applied. With regard to the functioning of the polarization-selective terminating plate, reference should be made to the description in connection with FIG. 3.

Figure 2:
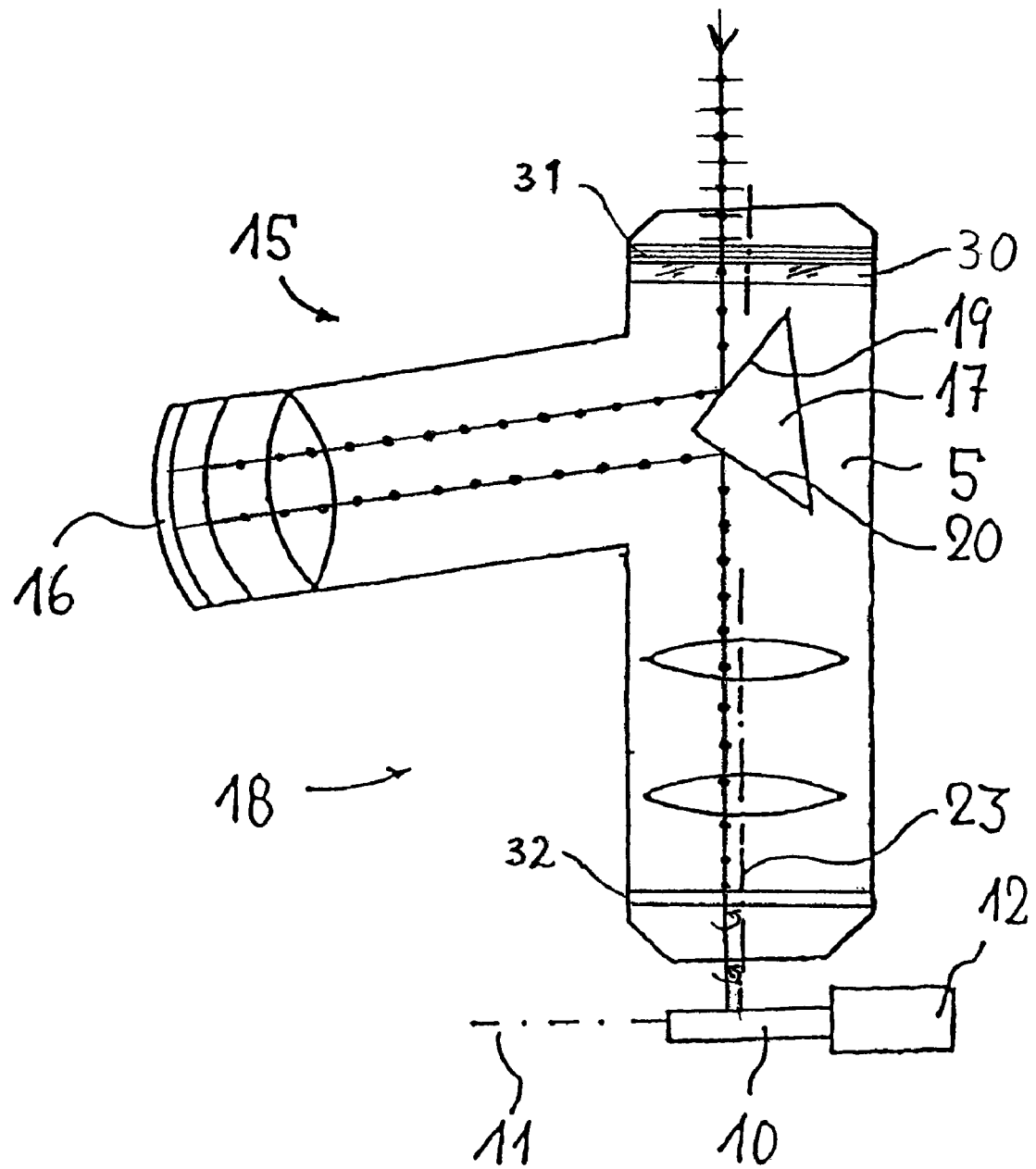
FIG. 2 is a schematic view of an embodiment of a projection objective according to the invention having a plane-parallel plate acting as a polarization splitter device in the vicinity of the light entry.

A view of an embodiment of a projection objective according to the invention is shown schematically in FIG. 2. The light which enters the projection objective is made available by the illumination system in unpolarized form in the case described here, but other polarization states, for example radial, circular or linear polarization states, of the entering light are also possible.

In front of the first deflection mirror 19 of the projection objective, a plane-parallel plate 30 made of $CaF_2$ or synthetic quartz glass is fitted, which lies in a plane perpendicular to the optical axis, so that it is trans-illuminated essentially perpendicularly by the light passing through the projection objective. This leads to the light path in the projection objective not being disrupted by the plate. Applied to the entry surface of this plate 30 is a polarization splitter structure 31 in the form of a diffraction grating with a structure width which lies below the wavelength of the light that passes through the projection objective. Such a grating, in which the diffractive structures point in a pre-defined direction, acts like a birefringent material, so that such a grating can be used as a polarization splitter. The grating 31 transmits essentially light having a first component of the electric field strength vector, whereas it essentially reflects light having a second component perpendicular to the first component of the electric field strength vector. The plate 30 covered with the diffraction grating 31 forms a polarization splitter device.

The manufacture of such gratings is described, for example, in the article "Electron-Beam Lithography for Fabricating Sub-Wavelength Grating on Quartz" by Shr-Jia Shiu and Hang-Peng Shieh (National Chiao Tung University Hsinchu, Taiwan). For a more detailed description of the functioning of polarization splitter structures with diffraction ratings, which comprise a plurality of periodically arranged layers, reference should be made to the article "Polarizing Beam Splitters Constructed of Form-Birefringent Multilayer Gratings" by R. -C. Tyan, P. -C. Sun and Y. Fainman in: SPIE, Vol. 2689, 82–89. A polarization splitter structure which has two diffraction gratings with structure widths below the light wavelength is described in US 2002/0164105 A1.

In the present embodiment, the linear polarization produced by the plate 30 and the diffraction grating 31 is chosen such that the field strength vector of the electric field is perpendicular to the plane of incidence of the light on the first diffraction mirror 19. The light coming from the plate 30 is reflected by the first deflection mirror 19, it proving to be beneficial that this is s-polarized with respect to the mirror plane, since s-polarized light is reflected by the mirror surface more intensely than p-polarized light, so that only a little light intensity is lost at the first deflection mirror 19.

The light reflected from the first deflection mirror 19 strikes the concave mirror 16, is reflected from the latter and then strikes the second deflection mirror 20, from which it is reflected in the direction of the image plane 11. In the reflection at the second deflection mirror 20, it again proves to be beneficial that the light is s-polarized with respect to the plane of incidence, so that only a little light intensity is lost at the second mirror 20.

The light passes further through the dioptric part 18 of the objective and, at the end of the latter, strikes a $\lambda/4$ plate 32, which has the purpose of converting the linearly polarized light coming from the dioptric part of the projection objective into circularly polarized light, so that no direction-dependent contrast differences are produced on the wafer 10.

When this embodiment of the invention is used, polarization-dependent, negative effects on the imaging quality, in particular the production of double images and of contrast differences that are dependent on the structure direction, are largely avoided.

Figure 3:
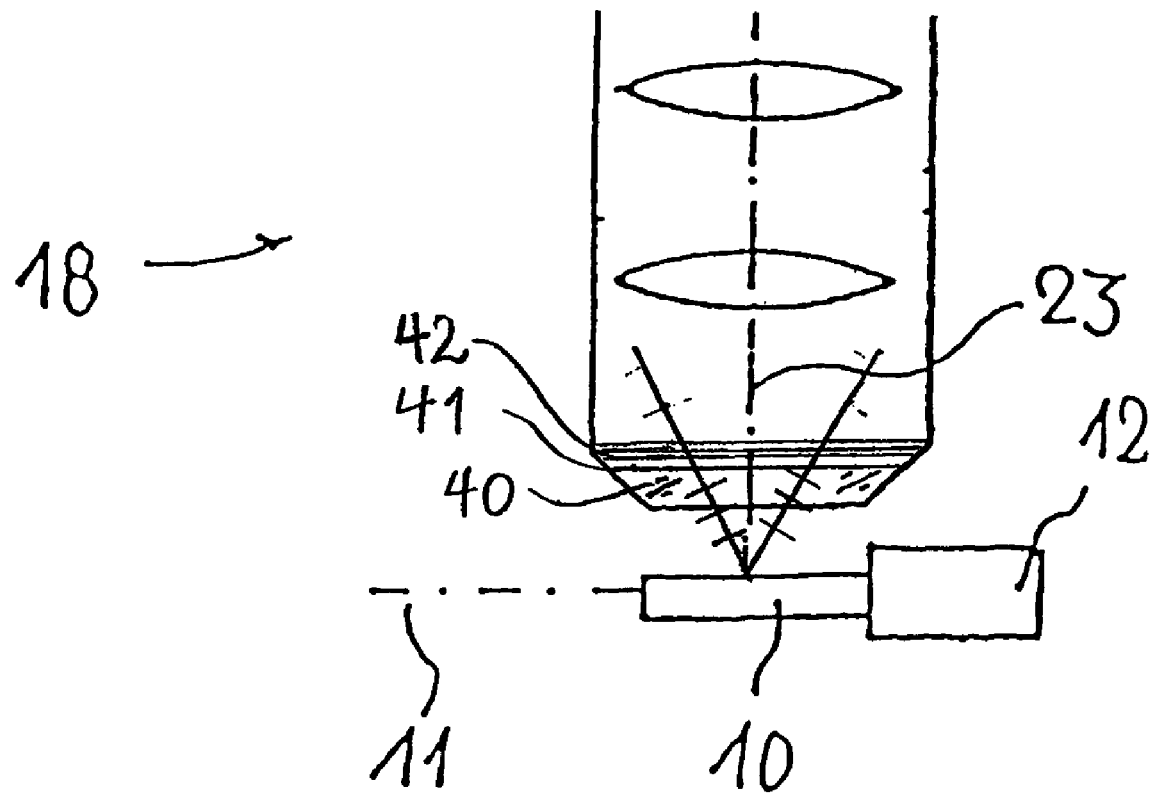
FIG. 3 is a schematic detailed view of the dioptric terminating part of an embodiment of a projection objective according to the invention having a terminating plate acting as a polarization splitter device.

A detailed view of the dioptric terminating part 18 of a projection objective is shown schematically in FIG. 3. The light passing through this dioptric part of the objective strikes a multilayer system 42 that is applied to the entry surface 41 of a terminating plate 40, which acts in a polarization-selective manner in such a way that said system allows only light that is p-polarized in relation to the plane of incidence of the terminating plate to pass through. In a preferred exposure process, the light at the end of the dioptric part has an annular distribution as a result of the use of an annular illumination mode in the illumination system. In this part of the objective close to the image, the light has a highly convergent beam path. The terminating plate 40 is fitted in a plane lying perpendicular to the optical axis 23, which, on account of the annular incidence of the light and the convergent beam path, is struck by the incident light in such a way that the planes of incidence of the incident light beams are arranged rotationally symmetrically with respect to the optical axis. Since the polarizing layers 42 let through only light polarized parallel to the planes of incidence of the light beams, and the planes of incidence are rotationally symmetrical with respect to the optical axis, after these layers, or after the terminating plate, radially polarized light is available for the production of the image on the wafer 10. This effects good injection of the light into the resist, since only a small proportion of the light intensity is lost by reflection during the injection of radially polarized light.

Figure 4:
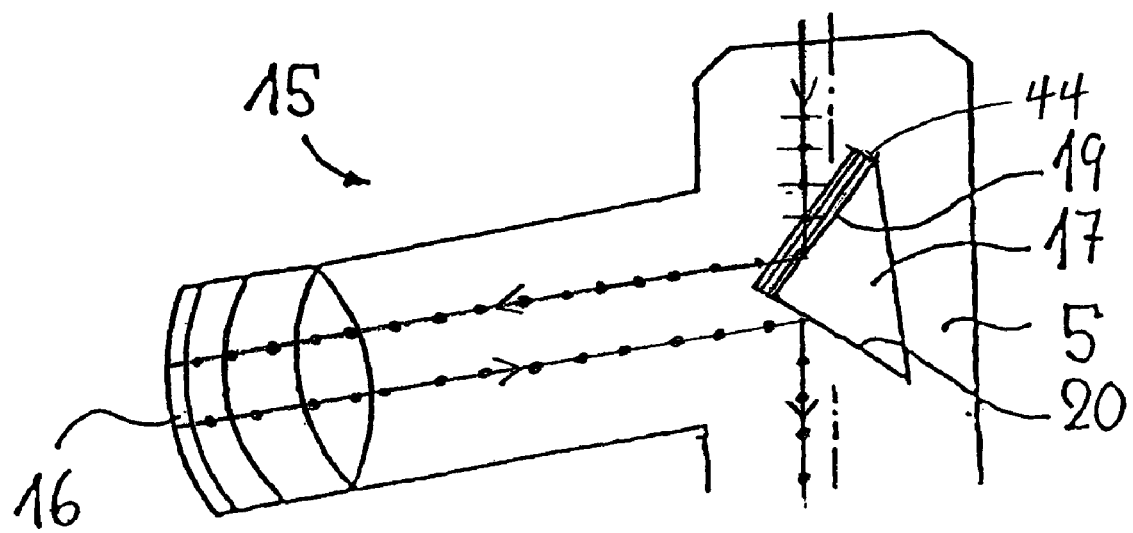
FIG. 4 is a schematic detailed view of the catadioptric objective part of an embodiment of a projection objective according to the invention having a first mirror surface acting as a polarization splitter device.

FIG. 4 shows a schematic detailed view of the catadioptric objective 15 of an embodiment of a projection objective according to the invention, having a first deflection mirror 19 acting as a polarization splitter device, a concave mirror 16 and a second deflection mirror 20. Applied to the first deflection mirror 19, acting as a polarization splitter device, is a dielectric multilayer system 44, which filters the unpolarized light coming from the illumination system into polarized light perpendicular to the plane of incidence of the first deflection mirror 19. It is possible to produce highly effective dielectric multilayer systems 44, so that the light which passes through the projection objective is present essentially in linearly polarized form after passing through such a multilayer system 44. The multilayer system 44 comprises a plurality of individual layers arranged one above another, which consist in an alternating sequence of materials with a high and low refractive index for the wavelength ranges used. As a result of the interference between the light beams reflected at these individual layers, light having a first direction of polarization is preferably reflected, whereas light having a second component perpendicular thereto is essentially discarded.

The light reflected from the first deflection mirror strikes the concave mirror 16, is reflected by the latter and reaches the second deflection mirror 20, from which the light path runs onwards into the dioptric part 18 of the objective. Since there is only s-polarized light upstream of the second deflection mirror 20, the light loss during the reflection at the second deflection mirror 20 can be kept low. In this embodiment, too, further changes in the polarization state can be effected in the following beam path, in order to obtain, for example, radial or tangential polarization in the image plane.

Figure 5:
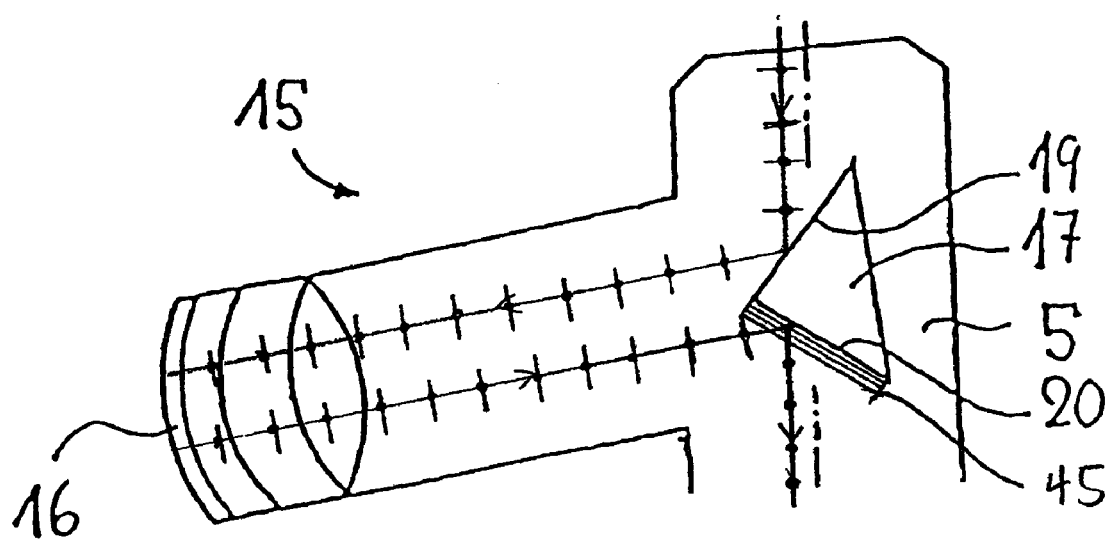
FIG. 5 is a schematic illustration of the catadioptric objective part of an embodiment of a projection objective according to the invention having a second mirror surface acting as a polarization splitter device.

FIG. 5 shows a schematic detailed view of the catadioptric objective part 15 of an embodiment of a projection objective according to the invention having a first deflection mirror 19, a concave mirror 16 and a second deflection mirror 20, which is formed as a polarization beam splitter. The unpolarized light coming from the illumination unit falls on the first deflection mirror 19, is reflected from the latter towards the concave mirror 16, which throws the light onto the second deflection mirror 20. Applied to the second mirror surface 20, acting as a polarization splitter device, are a plurality of dielectric layers 45, which filter the unpolarized light coming from the concave mirror into light polarized parallel to the plane of incidence of the second mirror surface. As a result, the following lenses in the dioptric part 18 of the projection objective can be effectively rendered nonreflective. In this embodiment, too, further changes in the direction of polarization can be performed in the following beam path, in order to obtain, for example, radial or tangential polarization in the image plane.

In the embodiments shown in FIGS. 3, 4 and 5, the polarization splitter device is formed by applying a polarization splitter structure to an optical element already present in the projection objective, whereas, for the embodiment shown in FIG. 2, an additional optical element in the form of a plane-parallel plate was introduced into the beam path.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The invention claimed is:

1. A projection objective for microlithography for imaging a pattern arranged in an object plane of the projection objective into an image plane of the projection objective, comprising:

between the object plane and the image plane, a catadioptric first objective part comprising a concave mirror and a beam deflection device and, behind the beam deflection device, a dioptic second objective part;

wherein the beam deflection device of the catadioptric first objective part comprises a first mirror surface for deflecting the radiation coming from the object plane to the concave mirror and a second mirror surface for deflecting the radiation reflected from the concave mirror in the direction of the second objective part, wherein at least one of the first mirror surface and the second mirror surface is a polarization splitter device which is operated only once in reflection between the object plane and the image plane; and wherein the polarization splitter device is designed to discard a direction of polarization of light impinging on the polarization splitter device such that substantially only one direction of polarization contributes to the formation of an image in the image plane.

2. The projection objective according to claim 1, wherein at least one delay element is fitted in the beam path downstream of the polarization splitter device, said delay element being formed such that the linear polarization produced by the polarization splitter device is substantially converted into circular polarization before the light exits from the projection objective.

3. The projection objective according to claim 1, wherein the polarization splitter device is a polarization-selective dielectric multilayer system.

4. A projection objective for microlithography for imaging a pattern arranged in an object plane of the projection objective into an image plane of the projection objective, comprising:

between the object plane and the image plane, a catadioptric first objective part with a concave mirror and a beam deflection device and, behind the beam deflection device, a dioptric second objective part;

wherein the beam deflection device comprises a first mirror surface for deflecting the radiation coming from the object plane to the concave mirror and a second mirror surface for deflecting the radiation reflected from the concave mirror in the direction of the second objective part, wherein at least one of the first mirror surface and the second mirror surface is a polarization splitter device which is operated only once in reflection between the object plane and the image plane.

5. The projection objective according to claim 4, wherein the first mirror surface is the polarization splitter device.

6. The projection objective according to claim 4, wherein the second mirror surface is the polarization splitter device.

* * * * *